US012003830B2

(12) United States Patent
Frecon, III et al.

(10) Patent No.: US 12,003,830 B2
(45) Date of Patent: *Jun. 4, 2024

(54) MEDIA ENVIRONMENT DRIVEN CONTENT DISTRIBUTION PLATFORM

(71) Applicant: Source Digital, Inc., Boyertown, PA (US)

(72) Inventors: Henry Lawrence Frecon, III, Boyertown, PA (US); Patrick Clay Greene, Boyertown, PA (US); Michael Eric Phillips, Boyertown, PA (US); Timothy J. Carroll, Boyertown, PA (US)

(73) Assignee: Source Digital, Inc., Boyertown, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/055,643

(22) Filed: Nov. 15, 2022

(65) Prior Publication Data

US 2023/0071225 A1 Mar. 9, 2023

Related U.S. Application Data

(63) Continuation of application No. 17/203,370, filed on Mar. 16, 2021, now Pat. No. 11,503,350, which is a
(Continued)

(51) Int. Cl.
*H04N 21/845* (2011.01)
*G06F 3/16* (2006.01)
(Continued)

(52) U.S. Cl.
CPC ........... *H04N 21/845* (2013.01); *G06F 3/165* (2013.01); *H03G 7/002* (2013.01); *H03G 7/007* (2013.01);
(Continued)

(58) Field of Classification Search
CPC .............. H04N 21/242; H04N 21/231; H04N 21/8586; H04N 21/234; H04N 21/233;
(Continued)

(56) References Cited

U.S. PATENT DOCUMENTS 5,874,955 A 2/1999 Rogowitz et al.
6,573,942 B1 6/2003 Crinon
(Continued)

FOREIGN PATENT DOCUMENTS

EP 2028659 A2 2/2009
WO 2003091990 A1 11/2003

OTHER PUBLICATIONS

International Search Report and Written Opinion for International Application No. PCT/IB2017/052033 dated Jun. 9, 2017.
(Continued)

*Primary Examiner* — Anthony Bantamoi
(74) *Attorney, Agent, or Firm* — Renner, Otto, Boisselle & Sklar, LLP (57) ABSTRACT

A method for a media environment driven content distribution platform includes obtaining synchronization data and ancillary data pegged to instants in the synchronization data, and communicating the synchronization data and the ancillary data pegged to the instants in the synchronization data such that subsequent alignment of the synchronization data to the content synchronizes the ancillary data pegged to the instants in the synchronization data derived from the content to the content.

17 Claims, 8 Drawing Sheets

Related U.S. Application Data continuation of application No. 16/099,582, filed as application No. PCT/US2017/026827 on Apr. 10, 2017, now Pat. No. 10,951,935, and a continuation-in-part of application No. 15/094,538, filed on Apr. 8, 2016, now Pat. No. 10,397,663.

(51) Int. Cl.
| | |
|---|---|
| *H03G 7/00* | (2006.01) |
| *H04N 21/231* | (2011.01) |
| *H04N 21/233* | (2011.01) |
| *H04N 21/234* | (2011.01) |
| *H04N 21/242* | (2011.01) |
| *H04N 21/422* | (2011.01) |
| *H04N 21/43* | (2011.01) |
| *H04N 21/433* | (2011.01) |
| *H04N 21/439* | (2011.01) |
| *H04N 21/44* | (2011.01) |
| *H04N 21/4722* | (2011.01) |
| *H04N 21/81* | (2011.01) |
| *H04N 21/858* | (2011.01) |

(52) U.S. Cl.
CPC ......... *H04N 21/231* (2013.01); *H04N 21/233* (2013.01); *H04N 21/234* (2013.01); *H04N 21/242* (2013.01); *H04N 21/42203* (2013.01); *H04N 21/43074* (2020.08); *H04N 21/433* (2013.01); *H04N 21/4394* (2013.01); *H04N 21/44008* (2013.01); *H04N 21/4722* (2013.01); *H04N 21/8586* (2013.01); *H04N 21/812* (2013.01)

(58) Field of Classification Search
CPC ........... H04N 21/845; H04N 21/42203; H04N 21/43074; H04N 21/433; H04N 21/4394; H04N 21/44008; H04N 21/4722; H04N 21/812; H04N 21/43079; H04N 21/235; H04N 21/4334; H04N 21/435; G06F 3/165; H03G 7/002; H03G 7/007
See application file for complete search history.

(56) References Cited

U.S. PATENT DOCUMENTS

| | | |
|---|---|---|
| 7,075,584 B2 | 7/2006 | Crinon |
| 7,188,353 B1 | 3/2007 | Crinon |
| 7,333,153 B2 | 2/2008 | Hartson |
| 8,051,453 B2 | 11/2011 | Arseneau et al. |
| 9,015,747 B2 | 4/2015 | Russell |
| 9,065,984 B2 | 6/2015 | Arseneau |
| 9,071,885 B2 | 6/2015 | Landers |
| 9,275,427 B1 | 3/2016 | Sharifi |
| 9,374,374 B2 | 6/2016 | Steinberg et al. |
| 9,548,894 B2 | 1/2017 | Glenn et al. |
| 2002/0056136 A1 | 5/2002 | Wistendhal et al. |
| 2003/0106069 A1 | 6/2003 | Crinon |
| 2007/0022438 A1 | 1/2007 | Arseneau |
| 2008/0019576 A1 | 1/2008 | Senftner et al. |
| 2011/0016172 A1 | 1/2011 | Shah |
| 2011/0063503 A1 | 3/2011 | Brand et al. |
| 2011/0321114 A1 | 12/2011 | Newell |
| 2012/0215329 A1 | 8/2012 | Jiang et al. |
| 2013/0014155 A1* | 1/2013 | Clarke ................ H04N 21/236 |
| 2013/0151970 A1 | 6/2013 | Achour |
| 2013/0160038 A1 | 6/2013 | Slaney et al. |
| 2013/0178966 A1 | 7/2013 | Magnusso et al. |
| 2013/0188095 A1 | 7/2013 | Hartson |
| 2013/0259211 A1 | 10/2013 | Vlack et al. |
| 2014/0310006 A1 | 10/2014 | Anguera Miro et al. |
| 2014/0359079 A1 | 12/2014 | Weill |
| 2015/0045920 A1 | 2/2015 | Liu |
| 2015/0110457 A1 | 4/2015 | Abecassis et al. |
| 2015/0189347 A1 | 7/2015 | Oztaskent et al. |
| 2015/0287416 A1 | 10/2015 | Brands |
| 2015/0294368 A1 | 10/2015 | Russell |
| 2015/0319506 A1 | 11/2015 | Kansara et al. |
| 2015/0373455 A1 | 12/2015 | Donaldson |
| 2016/0021421 A1 | 1/2016 | Panger |
| 2016/0182855 A1 | 6/2016 | Caligor et al. |
| 2016/0182871 A1 | 6/2016 | Ortiz et al. |
| 2016/0249115 A1 | 8/2016 | Lincke |
| 2017/0144074 A1 | 5/2017 | Brunstetter et al. |

OTHER PUBLICATIONS

Extended European Search Report corresponding with European Application No. 21216945.2 dated Sep. 12, 2022.
International Search Report for International Patent Application No. PCT/IB2017/052031 dated Jun. 16, 2017.
Anonymous, "Automated Content Recognition—creating content aware ecosystems", CSI Magazine, dated Sep. 2012, pp. 1-16, XP055380079 England.
Shumeet Saluja, et al., "Audio Fingerprinting: Combining Computer Vision & Data Stream Processing", IEEE International Conference on Acoustics, Speech and Signal Processing (ICASSP), Honolulu Hawaii, USA, dated Apr. 2007, pp. 11-213, XP055380185.
International Search Report and Written Opinion for corresponding International Application No. PCT/IB2017/026827 dated Oct. 9, 2018.

\* cited by examiner

MEDIA ENVIRONMENT DRIVEN CONTENT DISTRIBUTION PLATFORM

This application is a Continuation of U.S. application Ser. No. 17/203,370 filed on Mar. 16, 2021, which is continuation of U.S. patent application Ser. No. 16/099,582 filed on Nov. 7, 2018, now U.S. Pat App. No. 10,951,935, issued on Mar. 16, 2021, which is a PCT National Stage entry of International Application No. PCT/US2017/026827 filed on Apr. 10, 2017, which is a continuation-in-part of U.S. patent application Ser. No. 15/094,538 filed on Apr. 8, 2016, now U.S. Pat App. No. 10,397,663 issued on Aug. 27, 2019, the entire disclosures of which are hereby incorporated by reference.

BACKGROUND

Media content is produced, processed, and then transmitted to consumers. In addition to traditional media content, the proliferation of electronic communications technologies has allowed for mass delivery of ancillary data related to or enhancing the content. For example, technologies such as instant messaging provide a medium by which to deliver electronic information to a large number of people very quickly. Electronic devices including, for example, personal computers, mobile phones, personal digital assistants, smart phones, and television set-top boxes (e.g., cable set top boxes, satellite set top boxes, etc.), provide ready access to consumers of information. The type and content of ancillary data that may be delivered via modern communication technologies varies greatly and comprises everything from personal information to advertisement. Ancillary data can take on various forms from simple text, to graphics, to video, to content containing numerous layers of data.

But current technologies are deficient in managing such ancillary data to make it accessible to consumers in an efficient, scalable, and accurately aligned manner. Further, current technologies are deficient in providing proper analytics on the consumer's interest on the ancillary data.

SUMMARY OF THE INVENTION

The present disclosure provides methods and systems to address these problems. The present disclosure provides methods and systems to extract and mine ancillary data corresponding to valuable layers of any aspect of any type of production information from any type of programming production (entertainment, sports, news, etc.) and to make the layers available (e.g., broadcast, streaming, radio, etc.) within the programming itself.

The ancillary data may be time/frame/sample synchronized against the produced physical form of the content. This content may be real time or non-real time. The invention disclosed herein uses a dual path for ancillary data synchronization with content, enabling indirect connectivity and bypassing data roadblocks. Adding local fingerprinting to compare live events and those stored in a database provides a synchronization mechanism and it allows for feedback of data to provide updates and additional new information to the database.

Users may then engage (human and machine level activities) with the ancillary data ranging from information look ups, transactional activities through content as a store front models, brand synchronization engaging brand and product placement, advertising server intelligence, off line distribution and brokering to other social platforms, etc. The ancillary data may be channelized so that each channel can be brokered independently of another for different application intentions. Finally, the methods and systems allow for data analytics to be collected and aggregated around these activities and made available to interested parties.

The accompanying drawings, which are incorporated in and constitute a part of the specification, illustrate various example systems, methods, and so on, that illustrate various example embodiments of aspects of the invention. It will be appreciated that the illustrated element boundaries (e.g., boxes, groups of boxes, or other shapes) in the figures represent one example of the boundaries. One of ordinary skill in the art will appreciate that one element may be designed as multiple elements or that multiple elements may be designed as one element. An element shown as an internal component of another element may be implemented as an external component and vice versa. Furthermore, elements may not be drawn to scale.

DETAILED DESCRIPTION

Figure 1:
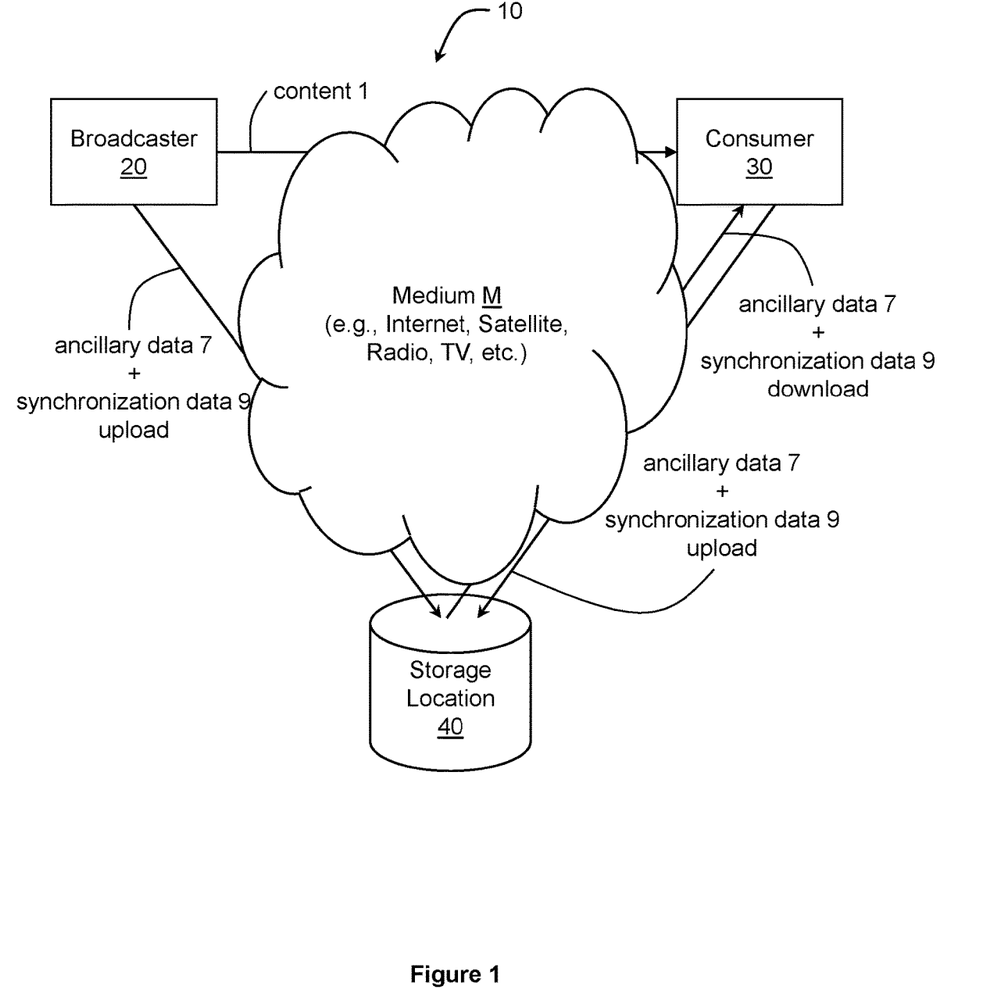
FIG. 1 illustrates a block diagram of an exemplary system for a media environment driven content distribution platform.
Figure 2:
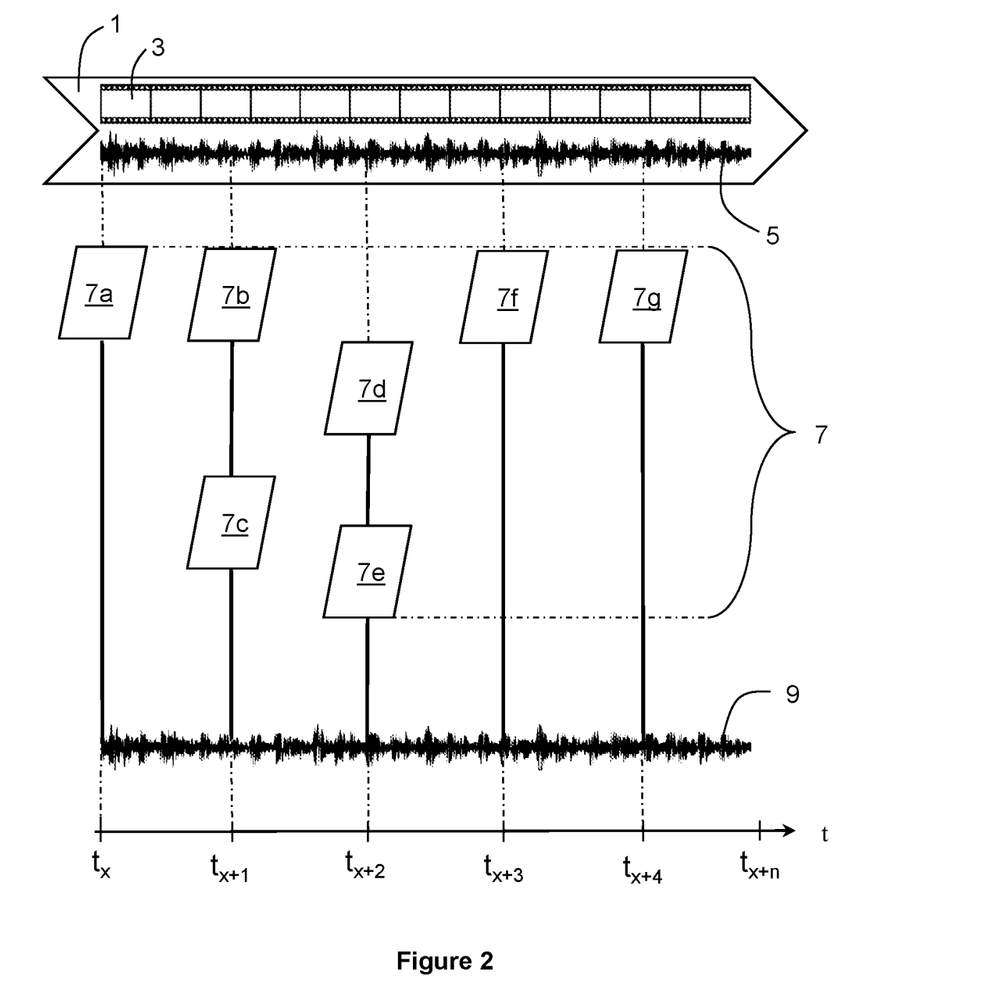
FIG. 2 illustrates a schematic diagram of an exemplary method for synchronizing ancillary data to content.

FIG. 1 illustrates a block diagram of an exemplary system 10 for a media environment driven content distribution platform. The system 10 includes three major components: the broadcaster 20, the consumer 30, and the storage location 40. FIG. 2 also shows the medium M through which the broadcaster 20, the consumer 30, and the storage location 40 communicate with each other.

FIG. 1 shows a content 1, which may be a movie, a TV show, a sports event (e.g., basketball game), Internet video, radio, etc. FIG. 1 also shows ancillary data 7, which is data that is somehow related to the content 1 and may include data describing the content such as content name or content identification data, data about a script played out in the content, data about wardrobe wore by characters in the content, data including comments from performers, producers, or directors of the content, an Uniform Resource Locator (URL) to a resource that includes information about the content, data about music in the audio of the content, etc. Ancillary data 7 may also include commercial data such as advertisement data. Ancillary data 7 may also include user data such as comments from viewers of the content (e.g., twitter messages, etc.) Ancillary data 7 may also include professional or technical data such as statistics of the content's audio including, for example, loudness or dynamic range scaling of the content's audio, etc. As can be seen from the above examples, what constitutes ancillary data 7 may vary widely and may be collected from many different sources.

Although for ease of explanation the present disclosure refers to the element 20 as the broadcaster 20, the element 20 is not limited to broadcasters or broadcasting facilities or equipment. In practice, the broadcaster 20 may represent any facility or equipment such as production, editing, quality control, or mastering equipment that touches the content 1 prior to and during playout for transmission or broadcasting.

Similarly, although for ease of explanation the present disclosure refers to the element 30 as the consumer 30, the element 30 is not limited to consumers or consumer premises or equipment. In practice, the consumer 30 may represent any premise or equipment that touches the content 1 during or post playout for transmission or broadcasting.

Also, the medium M may be any medium used to transmit content 1 or data generally such as, for example, the Internet, satellite communication, radio communication, television communication (broadcast or cable), etc. Although in the figures the medium M is shown as being shared by the broadcaster 20, the consumer 30, and the storage location 40, communication between these elements does not need to take place in the same medium. So, for example, the broadcaster 20 may communicate with the consumer 30 via satellite while the broadcaster 20 communicates to the storage location 40 via the Internet.

In the example of FIG. 1, the broadcaster 20 transmits the content 1 to the consumer 30 and the ancillary data 7 and the synchronization data 9 to the storage location 40 for storage. The consumer 30 receives the content 1 from the broadcaster 20 and the ancillary data 7 and the synchronization data 9 from the storage location 40. Interestingly, the consumer 30 may also transmit ancillary data 7 and/or synchronization data 9 to the storage location 40. Thus, the system 10 provides bidirectional communication by the consumer 30; the consumer 30 may participate in the creation of ancillary data 7, enhancing the ancillary data 7, the system's functionality and, ultimately, the customer's experience.

A significant issue that arises is synchronization; as a practical matter, how exactly is the ancillary data 7 time-aligned to the content 1. Current methods of synchronization of content and ancillary data require an explicit data connection between the content's source and the target or consumer. This explicit timing data communicates the timing to equipment at the consumer premises. These methods are also usually unidirectional from the source or content provider to the target or consumer, which is a limitation. Other current methods of synchronization rely on metadata attached to the content, which may or may not be present all the way through the signal chain from the source or content provider to the target or consumer since different facilities will use various workflows which may or may not support metadata.

FIG. 2 illustrates a schematic diagram of an exemplary method for synchronizing ancillary data 7 to content 1. This process aligns the ancillary data 7 against a physical form of the content 1, typically the finished program, be it for theatrical or television broadcast. As discussed in detail below, this alignment can happen in real time or in non-real time.

In a non-real time environment the alignment may occur according to a record known as an editorial decision list or EDL. An EDL is a record of all of the events that took place to produce the non-real time form of content. These events may be grouped according to the original script layout but may be re-shuffled, used, or not used, based on editorial decisions. EDL come in a variety of formats including, for example, XML or AAF. Both of these formats carry far richer metadata than traditional EDL from linear systems. In addition to event positing, ordering, and duration, these formats also contain all source information for each of the content clips used. Information in EDL may include frame numbers, scene numbers, acts, events, broadcast segments (e.g., commercial break entry points), characters, shot types, descriptions, script references, music, and other production data. Because EDL is a representation of boundaries of visual and audio events in the content, all ancillary data aligned to the content (automatic or manually) is also frame/time synchronized.

In the case of a real time environment the data layer is more dynamic and is built around a concept of pre-aligned information against a general program model. However the specifics of where the alignment occurs happens by triangulation of the actual aired time code against the pre-determined 0 start or 1 start range identified as the programs run-time or timecode to meet different delivery specifications such as broadcast or OTT or if a program has been frame rate converted to meet the needs of both foreign and domestic broadcast where total program duration and frame boundaries may change. The ancillary data to be aligned can be from pre-staged alignment or from aggregation feeds such as sports statistics or news statistics.

All of the above activities are underpinned by an expansive cloud based normalized object oriented data base model. The data base is built in such a way so as to move away from a relationship governance supported by hierarchical modeling and instead treating every piece of data as objects, essentially flattened out and sitting on their own blob. These blobs of data can be aligned in any relationship model, dictated by pre-determined relational alignment, automatic relational alignment motivated by an implicit decision logic, a manually driven relational alignment motivated by a programmatic assignment, or an on the fly relational model driven by external events or triggers. In all cases each piece of data within a data blob is assigned an internal identifier that is used as a key code when triangulating data, extending data, or modifying data.

They system 10 is media environment driven. This means that the ancillary data is distributed based on the media environment and specifically on changes in the media environmental state. The consumer or user receives ancillary data that corresponds to the media environment the user/consumer is experiencing. The simplest example is that of a movie with video and audio.

FIG. 2 shows a content 1, which in the illustrated embodiment includes video 3 and audio 5, and ancillary data 7. The ancillary data 7a is aligned to (i.e., it appears at or relates to) a time $t_x$ of the content 1. Ancillary data 7b and 7c appear at or relate to a time $t_{x+1}$ of the content 1. Ancillary data 7d and 7e appear at or relate to time $t_{x+2}$. Ancillary data 7f appears at or relates to time $t_{x+3}$ of the content 1 and ancillary data 7g appears at or relates to time $t_{x+4}$.

For example, ancillary data 7a at $t_x$ may indicate the content's name, True Blood, season 2, episode 2. At time $t_{x+1}$ (e.g., at 12 m 2 s) ancillary data 7b describes that Sookie Stackhouse, played by Anna Paquin is wearing Manolo Blahnik Hangisi 105 satin pump shoes while ancillary data 7c indicates that the music is Beethoven's Moonlight Sonata performed by the London Symphony Orchestra. Ancillary data 7d and 7e may be twitter messages received at time $t_{x+2}$ in which users express their reactions to the content 1 or a particularly scene in the content 1. Ancillary data 7f may indicate a change at $t_{x+3}$ in the prescribed loudness or dynamic range scaling of the content's audio due to a commercial break. Ancillary data 7g may indicate a change at $t_{x+4}$ in the prescribed loudness or dynamic range scaling of the content's audio due to a return to the content 1 from the commercial break.

But the concept of content distribution based on changes in the environmental state is not limited to movies. Virtual Reality (VR) and Augmented Reality (AR), for example, in their very nature are based on positional data as a result of the device itself. In the case of VR it may be a turn of the head with VR goggles, or with a VR-capable phone, moving it left to right, up and down, that triggers the distribution of specific ancillary data from the cloud to the user/consumer.

Regarding authorship or collection, ancillary data 7 may be obtained or collected prior to playout, broadcast, distribution or performance of the content 1. For example, ancillary data 7 may be obtained or collected during production, editing, quality control, or mastering of the content 1. Ancillary data 7 may also be obtained or collected during playout, broadcast, distribution or performance of the content 1. For example, if the content 1 is a TV show, ancillary data 7 may be obtained or collected during a first or subsequent broadcast of the TV show or anytime thereafter in cases of repeated viewings.

Any form of planning, such as the script, a program outline, the program run down, the as-run log, game or news program templates, etc., of the content to be produced may be indexed. These scripts or program outlines form a structural layout in a sequential order for which to ultimately assign program level data. In the case of script indexing, all of the scene level data may be indexed. This is information like characters, props, set information, etc.

As part of the script analysis process, the script may be parsed and cataloged based on its general industry components of: scene and number, location, and time of day (in story), characters, parenthetical (emotion or state at time of dialog) and dialog, action description and transition, page number and duration (⅛ page in script terms) and estimate real time. Each character can have a speaking rate (words/min) assigned to estimate time for each if needed.

Each elements becomes part of a fully interactive database where each elements is tracked and represented graphically to the user as to who, what, where, and when desired data is in the overall storyline. In addition to all relation permutations, a sentiment analysis may be done on a per "block" of "Action" and "Dialog" sections on a per character basis in order to track changes at the per spoken block of dialog per character or by entire scene and program. Versions can be compared as well as story arcs across multiple episode series. Is addition to user interactivity, all queries can have responses exported as structured XML for further downstream use in the overall database structure. Other forms of audio measurement can be used and tracked as visual overlay such as "phonemes per second" given any dialog input and used to compare versions of a given source. This same metadata can be correlated for music selection in mapping phonemes to beats (BPM)

The data that is entered pre-production or post production may be sourced from either hand-entered models, from internal applications acting as data Trojan Horses, or from affiliated partnering applications. These points of data inflow may be aligned against the content. The result is an inventory storage location of all of the production data acquired. Each piece of information collected may be assigned an internal set of codes or GUIDs (Global Unique Identifiers) so that they can be mapped virtually downstream.

Regarding storage and distribution, ancillary data 7 collected may be stored in a database that may be made accessible to future users or viewers of the content 1 in the case of data intended for consumers. This way, when the content 1 is later distributed to those users or viewers, the ancillary data 7 may be available to those users or viewers for consumption at the same time as the content 1. Similarly, ancillary data 7 collected may be stored in the same or a different database to be made accessible to, for example, broadcasters or advertisers in the case of consumer data collected. The ancillary data 7 appears or manifests itself aligned in time to the content 1.

Distribution may include exposing the aligned ancillary data such, as for example, using an Open/Active API, an Open/Passive API, ACR, or Key-code insertion.

An Open/Active API supports real-time event queries driven by consumer interaction with content in a play back mode. Active play back content viewing applications or applications aligned with active play back can query directly into this web service to retrieve their data. The web service works against running timecode or static timecode. The exposure to the information can be channelized/restricted so that specific subscribers can access a specific channel.

An Open/Passive API supports off line event queries driven by other applications or other non-content driven access models. This layer can be accessed as well by virtually any subscriber application that has permission, however the intention is to retrieve data in a non-active playback model.

An ACR model is discussed in more detail below in reference to FIG. 1. In essence, the ACR model involves using a fingerprint to identify the content and retrieve the associated ancillary data. The ACR model may include an acoustic fingerprint generation technology which utilizes the raw audio stream from a recorded piece of media such as a television broadcast or movie and creates a unique set of data—a "fingerprint"—which can be later used to for time-based content identification. Each ACR fingerprint which is generated identifies a piece of media and the time within that media. As explained below, the ACR model has both a server (broadcaster) side and client (consumer) side component. The server side component is responsible for generating acoustic fingerprints for a given media and the client "listening" side is responsible for capturing incoming audio from the client device's microphone, converting this to a fingerprint using the same ACR model and comparing this against a set of fingerprints to determine media time position. The ACR technology can be used in pre-recorded and real-time scenarios.

In the pre-recorded scenario, the ACR server generates a set of content fingerprints ahead of time and stores them in a database along with the associated ancillary data. The client app at a later time will load these fingerprints from the database along with relevant ancillary data such as characters, costumes, advertisements, etc. The client app may then listen to the microphone on the client device and begin generating fingerprints for the incoming audio stream. As fingerprints are generated they are compared against the pre-generated fingerprints for the media and upon successfully matching a fingerprint, the known time of the media is used to synchronize content to the ancillary data by, for example, displaying information about the actors that are on the screen at the current time.

In a real-time scenario, an audio source such as broadcasting station provides 1+ audio streams to the ACR server. Each stream is independently identified and fingerprinted over time and the generated fingerprints are published to the database along with the stream identification information such as Channel, Show, etc. The client app or consumer is provided these fingerprints in real time and uses the same algorithm to match the incoming audio on the microphone to the fingerprints being sent real-time from the broadcaster or server. Upon identification, the client app can provide the appropriate experience to the consumer.

In either scenario, upon successfully matching a fingerprint on the device to one of the server generated fingerprints, the app has determined both the media being watched and the time offset within that media. In addition to the end user experience, this information can then be published to a web service for data analytics gathering.

The Key-code insertion model allows for the insertion of the GUIDS into the program stream, VANC, or audio stream depending on the use model. These keys correspond to the contents aligned metadata and are authenticated through the open API. These Key-codes are reference points to the actual data that is assigned against a particular Key-code. These Key-codes are secure and understood only by the Source system. The Key-codes can be used to point back to any structural piece of information. Example, a Key-code for a dress worn by a particular character would be able to relate to an extensible set of metadata about the dress, the ability to take action around that metadata, and the dress role as part of information underneath the costume data channel.

The final layer of the architecture is the data analytics layer. This layer allows for the tracking and recording of any interaction with the content's ancillary data and the relationship of that interaction against a particular piece of content and/or where in the viewing of the content that interaction took place.

In the example of FIG. 2, the content 1 includes video 3 and audio 5. FIG. 2 also illustrates a synchronization data 9, which corresponds to a representation of the audio 5 of the content 1 in the form of an audio waveform signature. The synchronization data 9 matches the audio 5 of the content 1 at least to the extent that the audio 5 is identifiable from the synchronization data 9 along the time t. In the embodiment of FIG. 1, the ancillary data 7 are each pegged to the synchronization data 9 at instants of the synchronization data 9 corresponding to the instants of the audio 5 to which the ancillary data 7 is aligned.

In the example of FIG. 2, ancillary data A is pegged to the instant of synchronization data 9 corresponding to time $t_x$ of the content 1. Ancillary data 7b and 7c are pegged to the instant of synchronization data 9 corresponding to time $t_{x+1}$ of the content 1. Ancillary data 7d and 7e are pegged to the instant of synchronization data 9 corresponding to time $t_{x+2}$. Ancillary data 7f is pegged to the instant of synchronization data 9 corresponding to time $t_{x+3}$ of the content 1 and ancillary data 7g is pegged to the instant of synchronization data 9 corresponding to time $t_{x+4}$ of the content 1.

Each of the ancillary data 7 and the synchronization data 9 may then be stored in a database that may be made accessible to future users or viewers of the content 1. This way, when the content 1 is distributed to those users or viewers, the synchronization data 9 as well as the ancillary data 7 pegged to the synchronization data 9 may be available to those users or viewers.

At the user's premises, the content 1 being received may be compared real-time to the synchronization data 9 to synchronize the content 1 to the synchronization data 9. Moreover, since the ancillary data 7 is pegged to the instants of the synchronization data 9 corresponding to their respective times of the content 1, the ancillary data 7 may be synchronized to the content 1 even in the absence of explicit timing data.

The above example of FIG. 2 represents but one example of potential ways of synchronizing ancillary data 7 to content 1. Any other technology that creates a relationship between ancillary data and media content may be used. Other technologies that may be used to synchronize ancillary data to content include phonetic transcription alignment used by close captioning quality control products.

Figure 3:
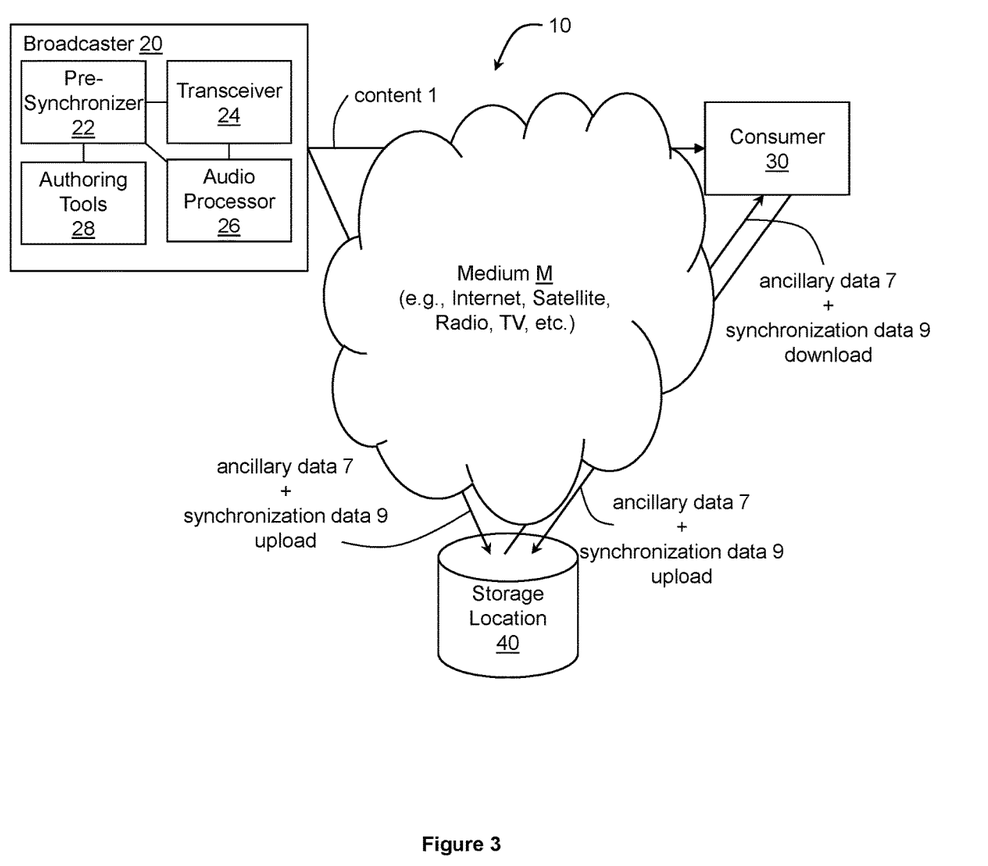
FIG. 3 illustrates a block diagram of the exemplary system including details at the broadcaster.

FIG. 3 illustrates a block diagram of the exemplary system 10 including details at the broadcaster 20. In the illustrated embodiment, the broadcaster 20 includes a pre-synchronizer 22 that pegs the ancillary data 7 to instants of the synchronization data 9 (e.g., the representation of the audio 5 of the content 1 of FIG. 1).

The broadcaster 20 may also include a transceiver 24 that communicates the content 1 to the consumer 30 and the synchronization data 9 and the ancillary data 7 pegged to the instants in the synchronization data 9 to the storage location 40 via the medium M. As described above, the storage location 40 is accessible by consumer 30. Alignment of the synchronization data 9 to the content 1 upon subsequent playout, broadcast, distribution, performance, etc. of the content 1 synchronizes the ancillary data 7 pegged to the instants in synchronization data 9 to the content 1.

The broadcaster 20 may also include an audio processor 26, which may process the audio 5 of the content 1 to create a representation of the content's audio 5 such as, for example, the audio waveform signature of FIG. 2. The transceiver 24 may then communicate the synchronization data 9 (e.g., the signature) and the ancillary data 7 pegged to the instants in the synchronization data 9 to the storage location 40.

In one embodiment, the pre-synchronizer 22 creates a link to the storage location 40. The link may be a Uniform Resource Identifier (e.g., URL) or similar location identifier or locator. The audio processor 26 may insert the link to the storage location 40 into metadata of the content 1 or specifically metadata of the content's audio 5. The audio 5 may be encoded as Dolby AC-4, AC-3 or E-AC-3 or MPEG-H, all of which can carry metadata. The consumer 30 may extract the link to the storage location 40 from the metadata of the content 1 or of the content's audio 5. Having the link to the storage location 40, the consumer 30 may then communicate to the storage location 40 to obtain the information stored in the storage location 40 or to store information therein.

As discussed above, the pre-synchronizer 22 may collect the ancillary data 7 during a previous playout or performance of the content 1. For example, the content 1 may be a basketball game which is originally broadcasted live. Ancillary data 7 may include up-to-date game statistics (e.g., points, rebounds, assists, etc.) Having access to this ancillary data 7 and its corresponding timing, the pre-synchronizer 22 may peg the ancillary data 7 to instants in a synchronization data 9 (e.g., a waveform signature) corresponding to the appropriate timing in the game when the statistics are accurate. The transceiver 24 may then transmit the ancillary data 7 and the synchronization data 9 to the storage location 40 for the consumer 30 to have access to the information to use as described above.

The broadcaster 20 may also include authoring tools 28 to collect ancillary data 7. The authoring tools 28 may allow, for example, a statistician to enter the statistics of the basketball game described above. In general, the authoring tools 28 may allow entry of ancillary data 7. The authoring tools 28 may be used to enter ancillary data describing the content such as content name or content identification data, data about a script played out in the content, data about wardrobe wore by characters in the content, data including comments from performers, producers, or directors of the content, an Uniform Resource Locator (URL) to a resource that includes information about the content, data about music in the audio of the content, etc. The authoring tools 28 may also be used to enter ancillary data 7 in the form of commercial data such as advertisement data or professional or technical data regarding or relating to the content.

Figure 4:
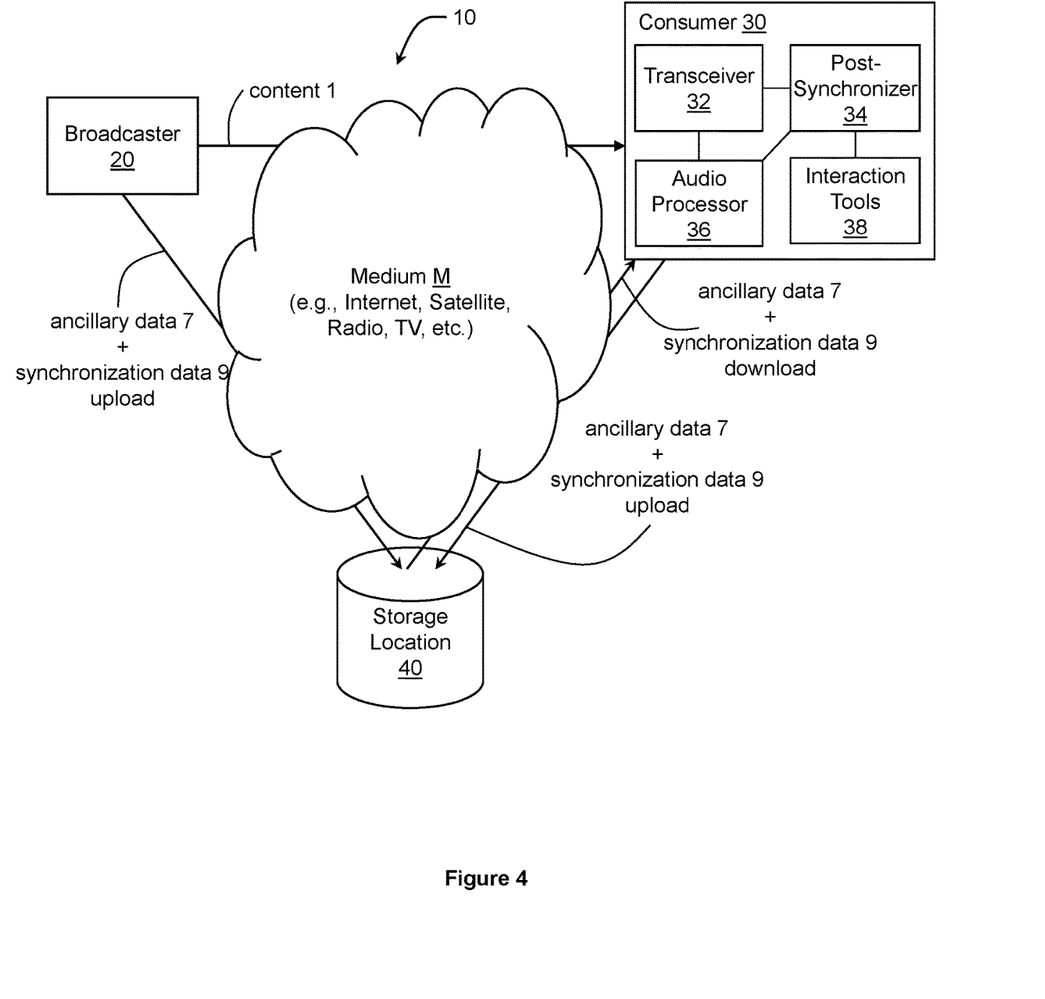
FIG. 4 illustrates a block diagram of the exemplary system including details at the consumer.

FIG. 4 illustrates a block diagram of the exemplary system 10 including details at the consumer 30. The consumer 30 may include a machine or group of machines for synchronizing ancillary data 7 to content 1.

In the illustrated embodiment, the consumer 30 includes a transceiver 32 that receives the content 1 from the broadcaster 20 and the synchronization data 9 and the ancillary data 7 pegged to instants in the synchronization data 9 from the storage location 40.

The consumer 30 may also include a post-synchronizer 34 that aligns the synchronization data 9 to the content 1 thereby synchronizing the ancillary data 7 to the content 1 as described above. The specific methodology by which the post-synchronizer 34 aligns the synchronization data 9 to the content 1 is not crucial to the present invention. Mechanisms by which such alignment may be accomplished include a variation of what is known as Automatic Content Recognition (ACR) and specifically a variation of what is known as fingerprinting. ACR are technologies used to identify or recognize content played on a media device or present in a media file. Acoustic fingerprinting generates unique fingerprints from the content itself. Fingerprinting techniques work regardless of content format, codec, bitrate and compression techniques. This makes it possible to use across networks and channels. Continuously comparing an ongoing, real-time fingerprint of the content 1 to the synchronization data 9 may be used to synchronize the ancillary data 7 timeline of the content 1.

The consumer 30 may also include an audio processor 36 that receives the content's audio 5 from the transceiver 32. In one embodiment, the audio processor 36 may extract metadata from the content 1 or from the content's audio 5 and, from the metadata, the audio processor may extract the link to the storage location 40 as described above. Having the link to the storage location 40, the transceiver 32 may then communicate to the storage location 40 to obtain the information stored in the storage location 40 or to store information therein.

Alternatively or in addition, the link to the storage location 40 may be distributed to the consumer 30 in a subscription basis or otherwise provided to the consumer 30. This way, if the content 1 as received by the consumer 30 does not include metadata or the metadata does not include the link to the storage location 40, the consumer 30 may still access the storage location 40.

In one embodiment, the audio processor 36 compares the content's audio 5 to the synchronization data 9 obtained from the storage location 40. Based on that comparison, the content 1 may be identified. That is, if the content's audio 5 and the synchronization data 9 match within a set of parameters, the content 1 may be identified as corresponding to the synchronization data 9 or vice versa. Similarly, if the content's audio 5 and the synchronization data 9 do not match within the set of parameters, the content 1 may be said to not correspond to the synchronization data 9 or vice versa.

The consumer 30 may also include interaction tools 38 that present (e.g., display) the ancillary data 7 in synchronicity with presentation of the content 1. The interaction tools 38 present the ancillary data 7 in synchronicity with presentation of the content 1 by relying on the aligning of the synchronization data 9 to the content 1. This aligning synchronizes the ancillary data 7, which is pegged to the instants in the synchronization data 9, to the content 1. In the basketball game example described above, the interaction tools 38 may display the up-to-date statistics of the basketball game in synchronicity with presentation of the game even when the game is replayed many years after the game was first televised live.

Because the storage location 40 stores the ancillary data 7 and the synchronization data 9, the information may be available for access at any time. For example, the consumer 30 may have recorded the basketball game (i.e., the content 1) in a digital video recorder (DVR) or obtain a recording of the game in any other way. A few days later the consumer may watch the game. The transceiver 32 may obtain the game (i.e., the content 1) from the DVR (or any other way the consumer 30 obtained the content) and may also obtain the synchronization data 9 and the ancillary data 7 from the storage location 40. The interaction tools 30 may then display the up-to-date statistics of the basketball game in synchronicity with presentation of the game, even when the game is replayed after the game was first televised live.

In one embodiment, the interaction tools 38 may also be used to collect ancillary data 7. For example, during a playout, broadcast, distribution or performance of the content 1, the consumer may enter, via the interaction tools 38, ancillary data 7 such as notes or comments relating to the content 1 or specific scenes or portions of the content 1. The post-synchronizer 34 may then peg the ancillary data 7 entered via the interaction tools 38 to instants of the synchronization data 9 corresponding to instants in the content 1 and store the ancillary data 7 to the storage location 40. In this case the synchronization data 9 may be a) a representation obtained from the storage location 40 or b) a representation created locally at the consumer 30 by the audio processor 36 and stored to the storage location 40 with the ancillary data 7.

Figure 5:
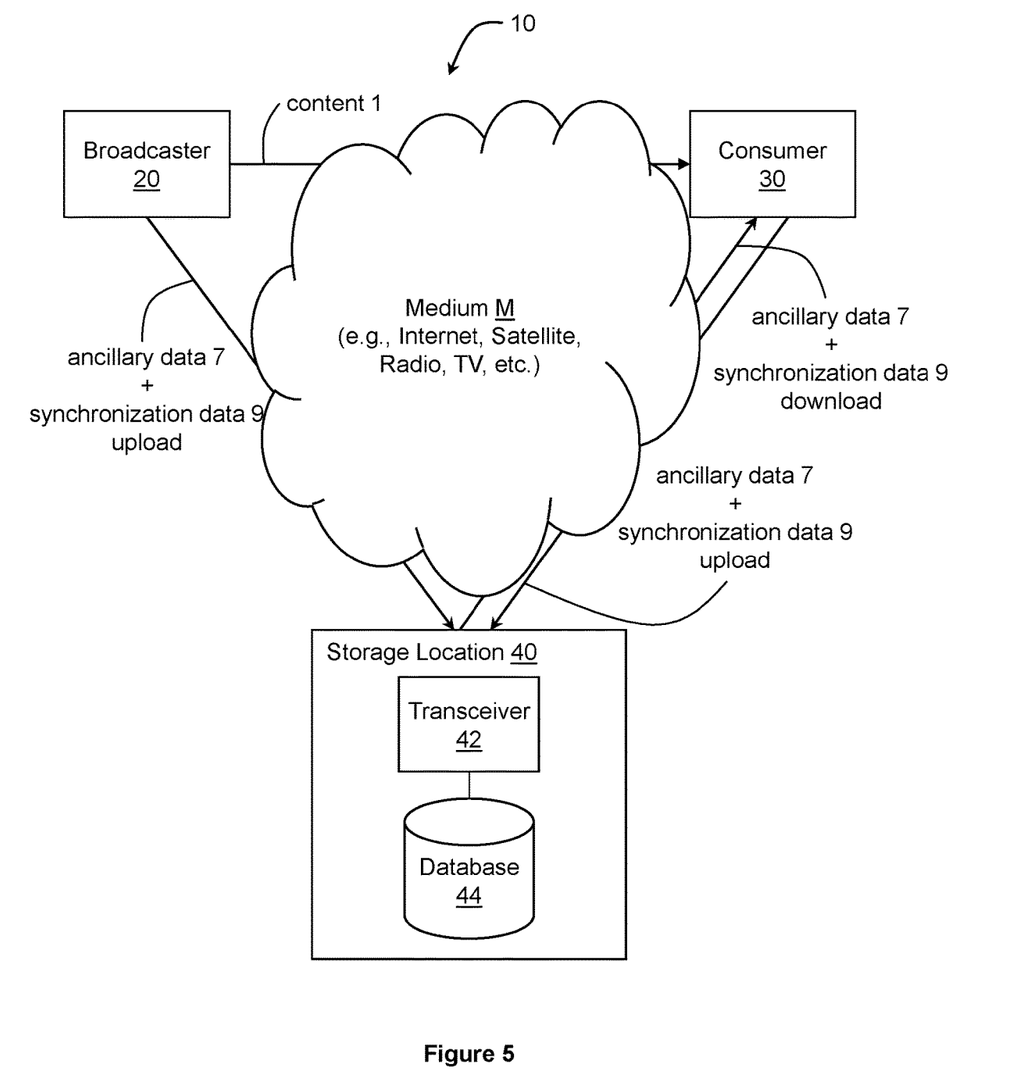
FIG. 5 illustrates a block diagram of the exemplary system including details at the storage location.

FIG. 5 illustrates a block diagram of the exemplary system 10 including details at the storage location 40. The storage location 40 may include a machine or group of machines for synchronizing ancillary data to content including audio. The storage location 40 may include a transceiver 42 that communicates (i.e., transmits and receives) the synchronization data 9 and the ancillary data 7. The storage location 40 may also include a database 44 that stores the synchronization data 9 and the ancillary data 7 pegged to instants in the synchronization data 9.

In one embodiment, the transceiver 42 communicates and the database 44 stores statistics of the content's audio 5 (e.g., loudness or dynamic range scaling) as ancillary data 7 or in addition to ancillary data 7 as described above. In one embodiment, the transceiver 42 continues to communicate and the database 44 continues to store ancillary data 7 during subsequent playout, broadcast, distribution or performance of the content 1 as described above.

The storage location 40 may be a location accessible to the broadcaster 20 and the consumer 30, such as the cloud or a local archive with general accessibility (e.g., via a link as described above) that may be controlled by subscription, password, etc.

The system 10 may be implemented using software, hardware, analog or digital techniques.

Figure 6:
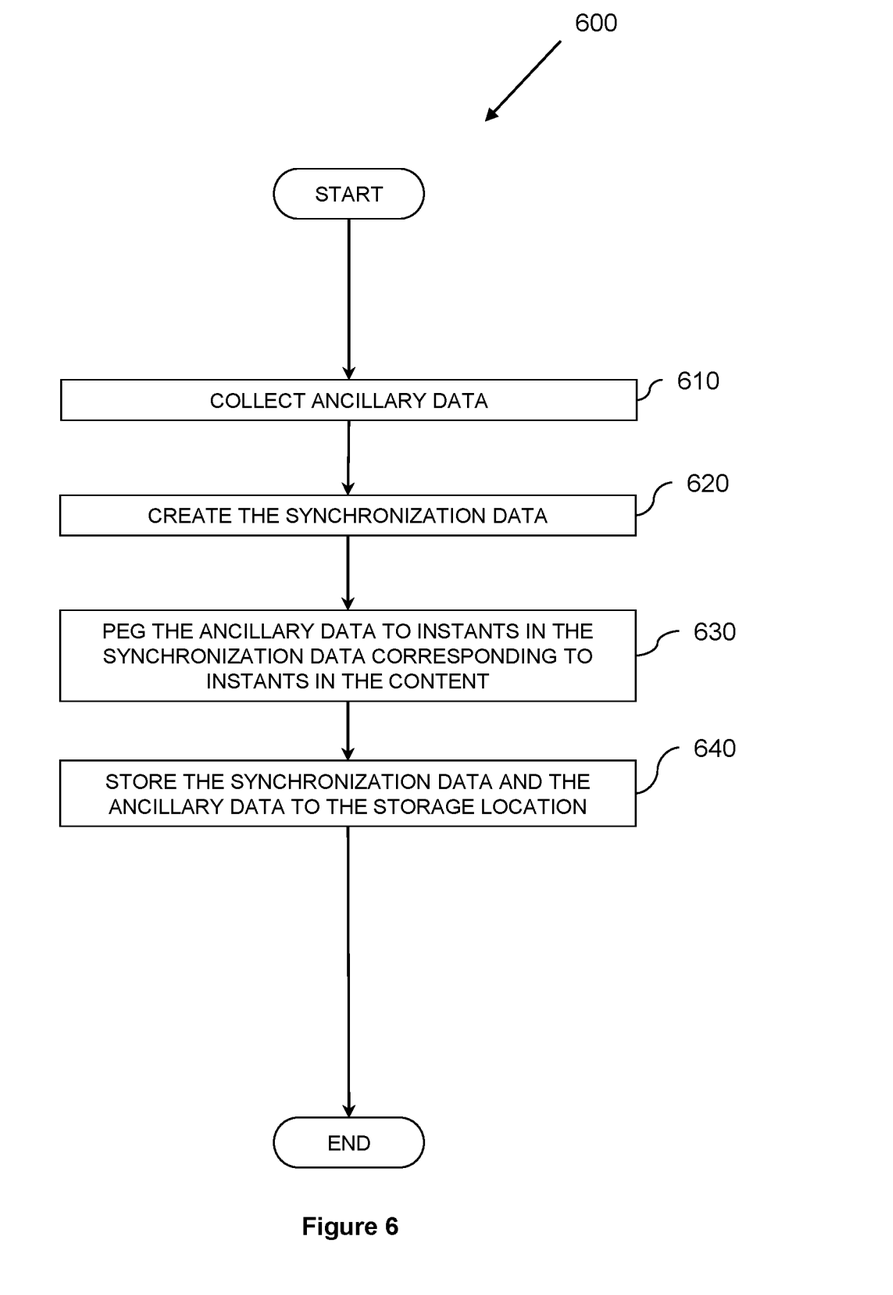
FIG. 6 illustrates a flow diagram for an exemplary method for synchronizing ancillary data to content including audio.
Figure 7:
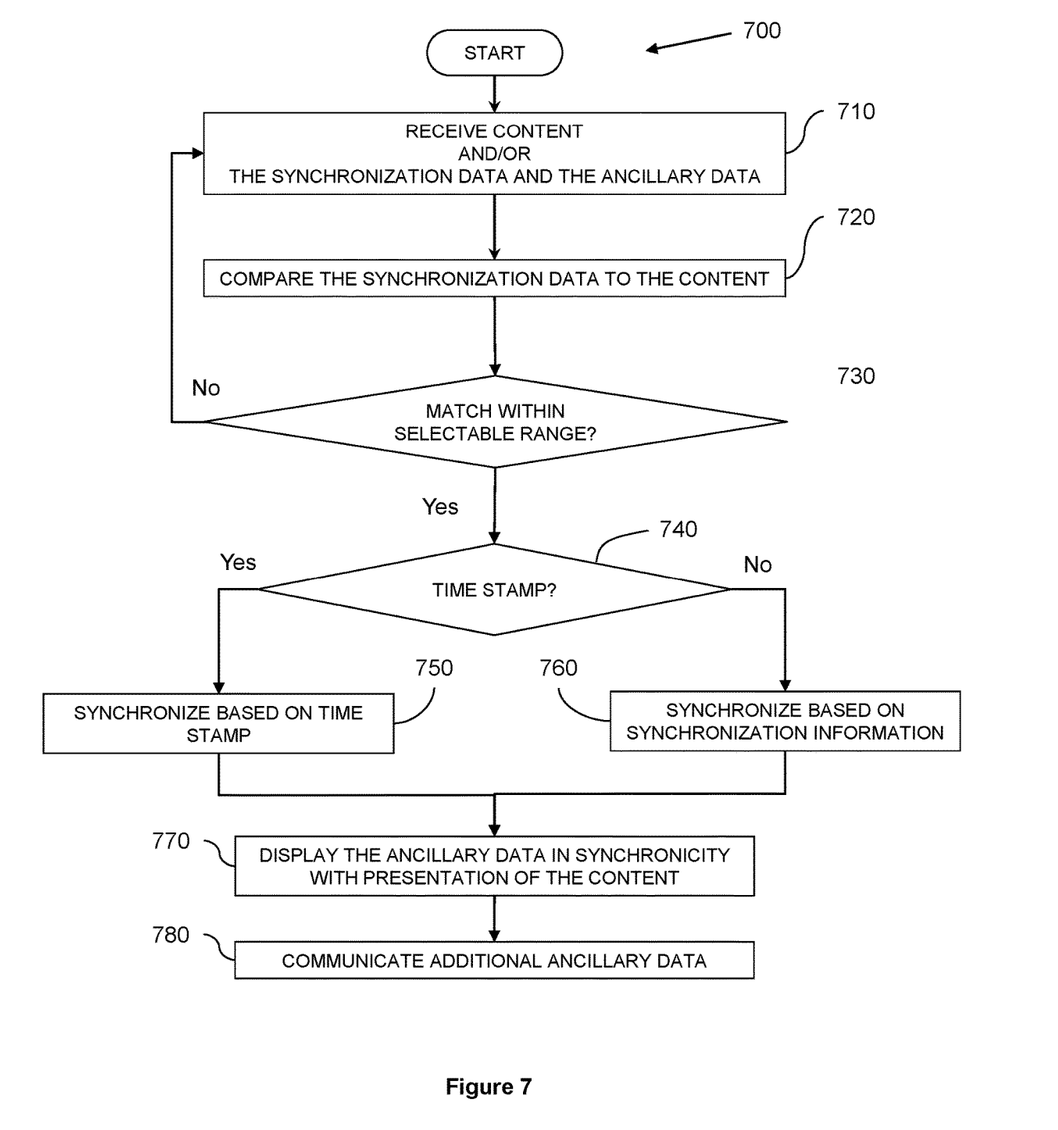
FIG. 7 illustrates a flow diagram for an exemplary method for synchronizing ancillary data to content including audio.

Exemplary methods may be better appreciated with reference to the flow diagrams of FIGS. 6 and 7. While for purposes of simplicity of explanation, the illustrated methodologies are shown and described as a series of blocks, it is to be appreciated that the methodologies are not limited by the order of the blocks, as some blocks can occur in different orders or concurrently with other blocks from that shown and described. Moreover, less than all the illustrated blocks may be required to implement an exemplary methodology. Furthermore, additional methodologies, alternative methodologies, or both can employ additional blocks, not illustrated.

In the flow diagrams, blocks denote "processing blocks" that may be implemented with logic. The processing blocks may represent a method step or an apparatus element for performing the method step. The flow diagrams do not depict syntax for any particular programming language, methodology, or style (e.g., procedural, object-oriented). Rather, the flow diagrams illustrate functional information one skilled in the art may employ to develop logic to perform the illustrated processing. It will be appreciated that in some examples, program elements like temporary variables, routine loops, and so on, are not shown. It will be further appreciated that electronic and software applications may involve dynamic and flexible processes so that the illustrated blocks can be performed in other sequences that are different from those shown or that blocks may be combined or separated into multiple components. It will be appreciated that the processes may be implemented using various programming approaches like machine language, procedural, object oriented or artificial intelligence techniques.

FIG. 6 illustrates a flow diagram for an exemplary method 600 for collecting and synchronizing ancillary data to content.

The method 600 includes at 610 collecting the ancillary data 7. Collection may take place prior to, during or post playout, broadcast, distribution or performance of the content as described above. The ancillary data 7 is data that is somehow related to the content and may include data describing the content such as content name or content identification data, data about a script played out in the content, data about wardrobe wore by characters in the content, data including comments from performers, producers, or directors of the content, an Uniform Resource Locator (URL) to a resource that includes information about the content, data about music in the audio of the content, etc. Ancillary data 7 may include commercial data such as advertisement data. Ancillary data 7 may also include user data such as comments from viewers of the content (e.g., twitter messages, etc.) Ancillary data 7 may also include professional or technical data such as statistics of the content's audio including, for example, loudness or dynamic range scaling of the content's audio, etc.

At 620, the method 600 further includes creating synchronization information such as, for example, creating audio fingerprints by analyzing the audio 5 of the content 1 to create the synchronization data 9. The synchronization data 9 may be created by creating an audio waveform signature of the content's audio as described above or by other methods.

At 630, the ancillary data 7 is pegged to instants in the synchronization information 9. Pegging the ancillary data 7 to instants in the synchronization information 9 means that the ancillary data 7 is time-aligned to the content 1. This pegging may be accomplished by associating the ancillary data 7 to a synchronization data 9 of a specific content 1 and time stamping the ancillary data 7 with times of instants in the synchronization data 9 or other time alignment methods.

At 640, the synchronization information (e.g., the synchronization data 9) and the ancillary data 7 pegged to instants in the synchronization information (e.g., the synchronization data 9) may be stored to the storage location 40.

FIG. 7 illustrates a flow diagram for an exemplary method 700 for distributing and synchronizing ancillary data.

At 710, the method 700 includes receiving the content 1 and/or the synchronization data 9.

At 720, a real-time signature of the content 1 may be compared to the synchronization data 9 to identify the content 1. For example, the client app on a customer device may be made to "listen" to the content 1 being played out. The client app has access to the database in which the ancillary data 7 pegged to the synchronization data 9 is stored. The client app may, thus, compare the content 1 being played out to the synchronization data 9.

If they match within a selectable range, at 730, the content 1 is identified.

At 740, if metadata (e.g., EMDF) is present and it includes a time stamp, at 750, the ancillary data 7 may be synchronized to the content 1 based on the time stamp.

If metadata is not present or it does not include the time stamp, at 760, the ancillary data 7 may be synchronized to the content 1 based on the synchronization information. For example, the synchronization data 9 may be aligned to the content's audio 5 as described above to synchronize the ancillary data 7 to the content 1.

The consumer application or the interaction tools 38, now synchronized to the content 1 may, at 770, display the ancillary data 7 in synchronicity with presentation of the content 1.

At 780, the method 700 may further communicate additional ancillary data 7 that may be viewed or accessed by other consumers, program producers, or possibly even advertisers. This data can also be used by downstream professional or consumer ad insertion mechanisms and owing to the detail-rich data that is present, potentially augmented by real-time updates or additions to that data, the insertions can be targeted with a much finer accuracy than previous static methods. The method 700 may continue to receive and synchronize new ancillary data 7 during subsequent playout, broadcast, distribution, or performance of the content 1.

While the figures illustrate various actions occurring in serial, it is to be appreciated that various actions illustrated could occur substantially in parallel, and while actions may be shown occurring in parallel, it is to be appreciated that these actions could occur substantially in series. While a number of processes are described in relation to the illustrated methods, it is to be appreciated that a greater or lesser number of processes could be employed and that lightweight processes, regular processes, threads, and other approaches could be employed. It is to be appreciated that other exemplary methods may, in some cases, also include actions that occur substantially in parallel. The illustrated exemplary methods and other embodiments may operate in real-time, faster than real-time in a software or hardware or hybrid software/hardware implementation, or slower than real time in a software or hardware or hybrid software/hardware implementation.

Figure 8:
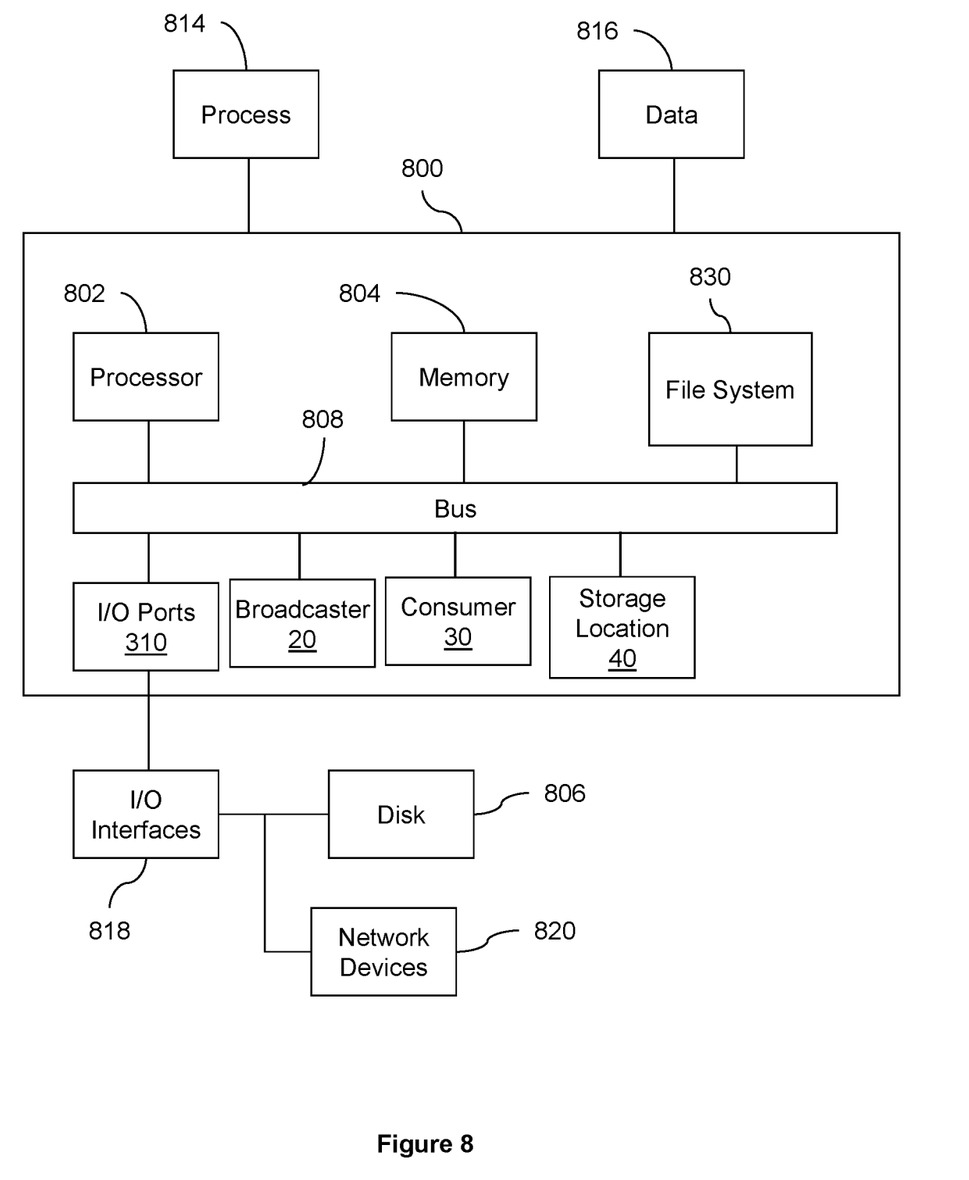
FIG. 8 illustrates a block diagram of an exemplary machine for synchronizing ancillary data to content including audio.

FIG. 8 illustrates a block diagram of an exemplary machine 800 for synchronizing ancillary data to content including audio. The machine 800 includes a processor 802, a memory 804, and I/O Ports 810 operably connected by a bus 808.

In one example, the machine 800 may receive input signals including the content 1, the video 3, the audio 5, the ancillary data 7, the synchronization data 9, etc. via, for example, I/O Ports 810 or I/O Interfaces 818. The machine 800 may also include the pre-synchronizer 22, the transceiver 24, the audio processor 26, and the authoring tools 28 of the broadcaster 20. The machine 800 may also include the transceiver 32, the post-synchronizer 34, the audio processor 36, and the interaction tools 38 of the consumer 30. The machine 800 may also include the transceiver 42 and the database 44 of the storage location 40. Thus, the broadcaster 20, the consumer 30, or the storage location 40 may be implemented in machine 1700 as hardware, firmware, software, or a combination thereof and, thus, the machine 1700 and its components may provide means for performing functions described herein as performed by the pre-synchronizer 22, the transceiver 24, the audio processor 26, the authoring tools 28, the transceiver 32, the post-synchronizer 34, the audio processor 36, the interaction tools 38, the transceiver 42 and the database 44.

The processor 802 can be a variety of various processors including dual microprocessor and other multi-processor architectures. The memory 804 can include volatile memory or non-volatile memory. The non-volatile memory can include, but is not limited to, ROM, PROM, EPROM, EEPROM, and the like. Volatile memory can include, for example, RAM, synchronous RAM (SRAM), dynamic RAM (DRAM), synchronous DRAM (SDRAM), double data rate SDRAM (DDR SDRAM), and direct RAM bus RAM (DRRAM).

A disk 806 may be operably connected to the machine 800 via, for example, an I/O Interfaces (e.g., card, device) 818 and an I/O Ports 810. The disk 806 can include, but is not limited to, devices like a magnetic disk drive, a solid state disk drive, a floppy disk drive, a tape drive, a Zip drive, a flash memory card, or a memory stick. Furthermore, the disk 806 can include optical drives like a CD-ROM, a CD recordable drive (CD-R drive), a CD rewriteable drive (CD-RW drive), or a digital video ROM drive (DVD ROM). The memory 804 can store processes 814 or data 816, for example. The disk 806 or memory 804 can store an operating system that controls and allocates resources of the machine 800.

The bus 808 can be a single internal bus interconnect architecture or other bus or mesh architectures. While a single bus is illustrated, it is to be appreciated that machine 800 may communicate with various devices, logics, and peripherals using other busses that are not illustrated (e.g., PCIE, SATA, Infiniband, 1394, USB, Ethernet). The bus 808 can be of a variety of types including, but not limited to, a memory bus or memory controller, a peripheral bus or external bus, a crossbar switch, or a local bus. The local bus can be of varieties including, but not limited to, an industrial standard architecture (ISA) bus, a microchannel architecture (MCA) bus, an extended ISA (EISA) bus, a peripheral component interconnect (PCI) bus, a universal serial (USB) bus, and a small computer systems interface (SCSI) bus.

The machine 800 may interact with input/output devices via I/O Interfaces 818 and I/O Ports 810. Input/output devices can include, but are not limited to, a keyboard, a microphone, a pointing and selection device, cameras, video cards, displays, disk 806, network devices 820, and the like. The I/O Ports 810 can include but are not limited to, serial ports, parallel ports, and USB ports.

The machine 800 can operate in a network environment and thus may be connected to network devices 820 via the I/O Interfaces 818, or the I/O Ports 810. Through the network devices 820, the machine 800 may interact with a network. Through the network, the machine 800 may be logically connected to remote computers. The networks with which the machine 800 may interact include, but are not limited to, a local area network (LAN), a wide area network (WAN), and other networks. The network devices 820 can connect to LAN technologies including, but not limited to, fiber distributed data interface (FDDI), copper distributed data interface (CDDI), Ethernet (IEEE 802.3), token ring (IEEE 802.5), wireless computer communication (IEEE 802.11), Bluetooth (IEEE 802.15.1), Zigbee (IEEE 802.15.4) and the like. Similarly, the network devices 820 can connect to WAN technologies including, but not limited to, point to point links, circuit switching networks like integrated services digital networks (ISDN), packet switching networks, and digital subscriber lines (DSL). While individual network types are described, it is to be appreciated that communications via, over, or through a network may include combinations and mixtures of communications.

Definitions

The following includes definitions of selected terms employed herein. The definitions include various examples or forms of components that fall within the scope of a term and that may be used for implementation. The examples are not intended to be limiting. Both singular and plural forms of terms may be within the definitions.

"Content" corresponds to still images, segments of audio media, video media, or audio/visual (AV) media and include information that is embodied, stored, transmitted, received, processed, or otherwise used with at least one medium. Common media content formats include FLV format (flash video), Windows Media Video, RealMedia, Quicktime, MPEG, MP3, DivX, JPEGs, and Bitmaps. As used herein, the terms "media clips", "media content," "information content," and "content" may be used interchangeably.

"Data store" or "database," as used herein, refers to a physical or logical entity that can store data. A data store may be, for example, a database, a table, a file, a list, a queue, a heap, a memory, a register, and so on. A data store may reside in one logical or physical entity or may be distributed between two or more logical or physical entities.

"Logic," as used herein, includes but is not limited to hardware, firmware, software or combinations of each to perform a function(s) or an action(s), or to cause a function or action from another logic, method, or system. For example, based on a desired application or needs, logic may include a software controlled microprocessor, discrete logic like an application specific integrated circuit (ASIC), a programmed logic device, a memory device containing instructions, or the like. Logic may include one or more gates, combinations of gates, or other circuit components. Logic may also be fully embodied as software. Where multiple logical logics are described, it may be possible to incorporate the multiple logical logics into one physical logic. Similarly, where a single logical logic is described, it may be possible to distribute that single logical logic between multiple physical logics.

An "operable connection," or a connection by which entities are "operably connected," is one in which signals, physical communications, or logical communications may be sent or received. Typically, an operable connection includes a physical interface, an electrical interface, or a data interface, but it is to be noted that an operable connection may include differing combinations of these or other types of connections sufficient to allow operable control. For example, two entities can be operably connected by being able to communicate signals to each other directly or through one or more intermediate entities like a processor, operating system, a logic, software, or other entity. Logical or physical communication channels can be used to create an operable connection.

In broadcasting, "playout" is a term for the transmission of radio or TV channels from the broadcaster into broadcast networks that delivers the content to the audience.

"Signal," as used herein, includes but is not limited to one or more electrical or optical signals, analog or digital signals, data, one or more computer or processor instructions, messages, a bit or bit stream, or other means that can be received, transmitted, or detected.

"Software," as used herein, includes but is not limited to, one or more computer or processor instructions that can be read, interpreted, compiled, or executed and that cause a computer, processor, or other electronic device to perform functions, actions or behave in a desired manner. The instructions may be embodied in various forms like routines, algorithms, modules, methods, threads, or programs including separate applications or code from dynamically or statically linked libraries. Software may also be implemented in a variety of executable or loadable forms including, but not limited to, a stand-alone program, a function call (local or remote), a servlet, an applet, instructions stored in a memory, part of an operating system or other types of executable instructions. It will be appreciated by one of ordinary skill in the art that the form of software may depend, for example, on requirements of a desired application, the environment in which it runs, or the desires of a designer/programmer or the like. It will also be appreciated that computer-readable or executable instructions can be located in one logic or distributed between two or more communicating, co-operating, or parallel processing logics and thus can be loaded or executed in serial, parallel, massively parallel and other manners.

Suitable software for implementing the various components of the example systems and methods described herein may be produced using programming languages and tools like Java, Pascal, C#, C++, C, CGI, Perl, SQL, APIs, SDKs, assembly, firmware, microcode, or other languages and tools. Software, whether an entire system or a component of a system, may be embodied as an article of manufacture and maintained or provided as part of a computer-readable medium as defined previously. Another form of the software may include signals that transmit program code of the software to a recipient over a network or other communication medium. Thus, in one example, a computer-readable medium has a form of signals that represent the software/firmware as it is downloaded from a web server to a user. In another example, the computer-readable medium has a form of the software/firmware as it is maintained on the web server. Other forms may also be used.

"User" or "consumer," as used herein, includes but is not limited to one or more persons, software, computers or other devices, or combinations of these.

Some portions of the detailed descriptions that follow are presented in terms of algorithms and symbolic representations of operations on data bits within a memory. These algorithmic descriptions and representations are the means used by those skilled in the art to convey the substance of their work to others. An algorithm is here, and generally, conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic and the like.

It has proven convenient at times, principally for reasons of common usage, to refer to these signals as bits, values, elements, symbols, characters, terms, numbers, or the like. It should be borne in mind, however, that these and similar terms are to be associated with the appropriate physical quantities and are merely convenient labels applied to these quantities. Unless specifically stated otherwise, it is appreciated that throughout the description, terms like processing, computing, calculating, determining, displaying, or the like, refer to actions and processes of a computer system, logic, processor, or similar electronic device that manipulates and transforms data represented as physical (electronic) quantities.

For ease of explanation, the present disclosure describes examples in the context of the nomenclature described in ETSI TS 102 366 (Annex H) such as, for example, the Extensible Metadata Format (EMDF) used to carry information and control data about audio signals into which it is embedded. The principles of the present disclosure, however, are not limited to that context and may be practiced in various other contexts including any such embedded metadata schemes included with any compressed audio including ETSI TS 103 190 (section 4.3.15) or baseband PCM audio system including metadata as described in ATSC A52:2012 and A/85:2013 or even the SMPTE 337M standard.

To the extent that the term "includes" or "including" is employed in the detailed description or the claims, it is intended to be inclusive in a manner similar to the term "comprising" as that term is interpreted when employed as a transitional word in a claim. Furthermore, to the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

While example systems, methods, and so on, have been illustrated by describing examples, and while the examples have been described in considerable detail, it is not the intention of the applicants to restrict or in any way limit scope to such detail. It is, of course, not possible to describe every conceivable combination of components or methodologies for purposes of describing the systems, methods, and so on, described herein. Additional advantages and modifications will readily appear to those skilled in the art. Therefore, the invention is not limited to the specific details, the representative apparatus, and illustrative examples shown and described. Thus, this application is intended to embrace alterations, modifications, and variations that fall within the scope of the appended claims. Furthermore, the preceding description is not meant to limit the scope of the invention. Rather, the scope of the invention is to be determined by the appended claims and their equivalents.

What is claimed is:

1. A machine or group of machines for a media environment driven content distribution platform, comprising:
    a pre-synchronizer configured to obtain ancillary data and synchronization data and to correlate the ancillary data to times in the synchronization data such that subsequent synchronization of the synchronization data to the content synchronizes the ancillary data, correlated to the times in the synchronization data, to the content, wherein specific objects of the ancillary data are distributed based on event data relating to the media environment; and a transceiver configured to communicate the synchronization data derived from the content and the ancillary data correlated to the times in the synchronization data to a storage location;

wherein the ancillary data includes a first ancillary data object and a second ancillary data object that are both correlated to a same time in the synchronization data, and the first ancillary data object and not the second ancillary data object is distributed based on the event data relating to the media environment.

2. The machine or group of machines of claim 1, wherein the presynchronizer is configured to receive ancillary data in the form of:

data about music in the content,
data about a script played out in the content,
data about wardrobe wore by characters in the content,
data describing the content,
data including comments from performers, producers, or directors of the content,
data including comments from viewers of the content,
data including a Uniform Resource Locator (URL) to a resource that includes information about the content, advertisement data, or statistics of the content including at least content name or content identification.

3. The machine or group of machines of claim 1, wherein:
the transceiver is configured to communicate the synchronization data and the ancillary data correlated to the times in the synchronization data to a database accessible by consumers of the content.

4. The machine or group of machines of claim 1, wherein:
the transceiver is configured to communicate the synchronization data and the ancillary data correlated to the times in the synchronization data to a storage location accessible by consumers of the content; and the pre-synchronizer is configured to create a link to the storage location.

5. The machine or group of machines of claim 1, comprising:
a processor configured to create the synchronization data, wherein:
the transceiver is configured to communicate the synchronization data and the ancillary data correlated to the times in the synchronization data to a storage location accessible by consumers of the content;
the pre-synchronizer is configured to create a link to the storage location; and
the processor is configured to insert the link to the storage location into metadata of the content.

6. The machine or group of machines of claim 1, wherein:
the pre-synchronizer is configured to collect the ancillary data during a previous playout or performance of the content and to correlate the ancillary data to times in the synchronization data corresponding to times in the content.

7. The machine or group of machines of claim 1, comprising:
a processor configured to create the synchronization data and transmit the synchronization data to the pre-synchronizer.

8. The machine or group of machines of claim 1, comprising:
an audio processor configured to create the synchronization data by creating an audio waveform signature of the content's audio.

9. The machine or group of machines of claim 1, comprising:

authoring tools configured to collect the ancillary data during a playout or performance of the content for correlating the ancillary data to the times in the synchronization data.

10. A machine or group of machines for a media environment driven content distribution platform, comprising:
a transceiver configured to obtain the content, synchronization data, and ancillary data correlated to times in the synchronization data; and
a post-synchronizer configured to synchronize the synchronization data to the content thereby synchronizing the ancillary data correlated to the times in the synchronization data from the to the content;
wherein specific objects of the ancillary data are distributed based on the media environment, the ancillary data includes a first ancillary data object and a second ancillary data object that are both correlated to a same time in the synchronization data, and the event data dictates that the first ancillary data object and not the second ancillary data object is to be distributed based on the media environment.

11. The machine or group of machines of claim 10, wherein the transceiver is configured to receive the ancillary data in the form of:
data about music in the content,
data about a script played out in the content,
data about wardrobe wore by characters in the content,
data describing the content,
data including comments from performers, producers, or directors of the content,
data including comments from viewers of the content,
data including a Uniform Resource Locator (URL) to a resource that includes information about the content,
advertisement data, or
statistics of the content including at least content name or content identification.

12. The machine or group of machines of claim 10, comprising:
interaction tools configured to collect the ancillary data during a playout or performance of the content for correlating the ancillary data to the times in the synchronization data.

13. The machine or group of machines of claim 10, comprising:
a processor configured to receive the content from the transceiver and extract from metadata of the content a link to storage location in which the synchronization data and the ancillary data correlated to the times in the synchronization data are stored and accessible by consumers of the content; and
the transceiver is configured to obtain the synchronization data and the ancillary data correlated to the times in the synchronization data from the storage location.

14. The machine or group of machines of claim 10, comprising:
a processor configured to compare the content to the synchronization data to identify the content.

15. The machine or group of machines of claim 10, comprising:
interaction tools configured to display the ancillary data in synchronicity with presentation of the content relying on the synchronizing of the synchronization data to the content.

16. A machine or group of machines for a media environment driven content distribution platform, comprising:
a database configured to store synchronization data and ancillary data correlated to times in the synchronization data such that subsequent synchronization of the synchronization data to the content synchronizes the ancillary data correlated to the times in the synchronization data to the content; and a transceiver configured to communicate the synchronization data and the ancillary data correlated to the times in the synchronization data;

wherein specific objects of the ancillary data are distributed based on the media environment; and the ancillary data includes a first ancillary data object and a second ancillary data object that are both correlated to a same time in the synchronization data, and the event data dictates that the first ancillary data object and not the second ancillary data object is to be distributed based on the media environment.

17. The machine or group of machines of claim 16, wherein the database is configured to continue to receive and store the ancillary data during subsequent playout or performance of the content, wherein the ancillary data is correlated to the times in the synchronization data derived from the corresponding to times in the content during the subsequent playout or performance.

* * * * *